United States Patent [19]

Ono et al.

[11] Patent Number: 4,784,899
[45] Date of Patent: Nov. 15, 1988

[54] ELECTROCONDUCTIVE NONWOVEN FABRIC-RESIN COMPOSITE ARTICLES AND METHOD FOR PRODUCTION THEREOF

[75] Inventors: Nobuhiro Ono; Hiroyuki Kitamura; Masanori Nishiura, all of Ueno, Japan

[73] Assignee: Inax Corporation, Tokoname, Japan

[21] Appl. No.: 27,183

[22] Filed: Mar. 16, 1987

[30] Foreign Application Priority Data

Mar. 17, 1986 [JP] Japan .................................. 61-60230

[51] Int. Cl.⁴ ............................................... B32B 7/00
[52] U.S. Cl. ..................................... 428/236; 264/1.9; 264/108; 264/113; 264/258; 428/248; 428/252; 428/286; 428/287
[58] Field of Search ............... 428/236, 252, 286, 287, 428/248; 264/1.9, 108, 113, 258

[56] References Cited
U.S. PATENT DOCUMENTS 4,554,204 11/1985 Ono ..................................... 428/246

Primary Examiner—Marion C. McCamish
Attorney, Agent, or Firm—Browdy and Neimark

[57] ABSTRACT

There are provided an FRP molded article and a method for production thereof, which has the properties of uniformly reflecting and shielding electromagnetic waves. The molded article comprises a compression-molded laminated structure composed essentially of an electroconductive nonwoven fabric-resin composite surface layer (3), a woven fabric-resin composite intermediate layer (2) and a fiber material reinforced resin substrate layer (1), wherein the nonwoven fabric composite layer substantially contains no bubbles. The molded article can be produced by placing, on a mold, an electroconductive nonwoven fabric substantially containing no liquid resin material, a woven fabric or a prepreg thereof, and a mixture of a reinforcing fiber material and a liquid crosslink-curable resin composition; subjecting the molding materials to depressurization treatment in the mold; and then subjecting the molding materials to compression molding. The molded articles can be advantageously used, for example, as reflecting dish antennas as well as shielding sheets or boards for electromagnetic waves. In the preferred embodiment, the molded article contains about 90% or less of the cured resin component by weight of the resin component of the corresponding conventional molded article, whereby deformation due to molding strain is decreased.

18 Claims, 2 Drawing Sheets

ELECTROCONDUCTIVE NONWOVEN FABRIC-RESIN COMPOSITE ARTICLES AND METHOD FOR PRODUCTION THEREOF

BACKGROUND OF THE INVENTION

1. Field of the Invention

This invention relates to a fiber reinforced resin (hereinafter sometimes referred to as FRP) molded article which comprises an electro-conductive nonwoven fabric-resin composite surface layer and has the properties of uniformly reflecting and shielding electromagnetic waves; and a method for production thereof. According to the present invention, there are provided FRP moded articles which are useful as, for example, reflectors of antennas for receiving or transmitting eectromagnetic waves, as well as a method for producing the articles effectively and efficiently without producing substantially inferior articles.

Prior Art

Hitherto, for providing FRP articles and the like with electromagnetic wave reflecting and/or shielding properties, there have been conducted (a) application onto the surfaces of the FRP articles of electroconductive paints, or application of metallic materials thereto by means of flame spraying, chemical plating, vapor deposition, spattering, or ion-plating; or (b) incorporating metal fillers, short metal fibers, metal ribbons, metal foils, metal flakes or the like into FRP materials, and then molding the resulting materials, etc. These methods, however, had problems with respect to performances, stability, endurance, cost and/or molding processability and, thus, were not practicable.

In the case where electroconductive short fibers were added to FRP resins and the resulting materials were press molded, the fibers were orientated or dispersed nonuniformly. Thus, such method required very large amounts of the fibers and resins and resulted in unstable performances and high costs of the resulting product. Molding by means of injection was still more unsatisfactory. On the other hand, in the case where an electroconductive nonwoven fabric was used instead of the short fibers and was press molded together with a substrate layer, the nonwoven fabric nonuniformly moved and dispersed, and, moreover, fractured to substantially fail in practical molding. When a hand lay-up molding method is used instead of the press molding method, waviness is caused by shrinkage upon curing of the FRP to deform the resulting molded article. Thus, the hand lay-up method is not practical in view of surface precision of the product and workability.

The present inventors proposed a molded article having properties of reflecting and shielding electromagnetic waves and a method for production thereof which comprised laying between an electroconductive nonwoven fabric layer and an FRP substrate layer a woven fabric layer and compression molding the resulting layers by using a liquid resin composition for the FRP (e.g. U.S. Pat. No. 4,554,204). According to this method, there can be obtained a molded article having electromagnetic waves-reflecting and shielding properties practicaly satisfactory to some extent. Strictly, however, there still remain the following main problems from the industrial and commercial viewpoints. Namely. (a) since an electroconductive nonwoven fabric surface layer is used to uniformly reflect and shield electromagnetic waves, lots of bubbles are formed at the interface between the surface layer and a mold surface (namely, at the molding surface of the nonwoven fabric layer) and also substantial amounts of bubbles are formed in the nonwoven fabric layer as well as in the intermediate woven fabric layer. Thus, the resulting molded article is lowered in commercial value because of it's poor appearance and is sometimes deteriorated in performance. (b) The present inventors have found that the formation of the bubbes mentioned above can be practically decreased by increasing the amount of the resin used. Use of a large amount of the resin, however, causes deformation and strain due to molding shrinkage even when a thermoplastic resin having a low shrinkage factor is added, which results in lowering uniform reflection precision such as performances of antennas and the like. Moreover, because a large amount of the resin moves through the nonwoven fabric during molding, the nonwoven fabric is apt to become disordered to deteriorate reflecting and shielding properties of the molded article. (c) If a material preliminarily impregnated with a liquid resin composition is used for the nonwoven fabric layer mainly to decrease the moving amount of the resin in the above mentioned step (b), the resin adheres to the surface of the heated mold when the material is placed on the mold. Thus, adjustment of placing said material becomes difficult. Moreover, if a long time is required for the placing adjustment, the liquid resin composition pregels to cause hardening non-uniformity, whereby it becomes difficult to form uniformly reflecting and shielding surfaces by compression molding.

SUMMARY OF THE INVENTION

The main object of the present invention is to provide an FRP molded article having properties of uniformly reflecting and shielding electromagnetic waves and to provide a method for production thereof, wherein the above mentioned problems are substantially eliminated. The present inventors paid attention to the combined conditions of a nonwoven fabric layer used as a surface layer, a liquid thermosetting resin and a compression-curing molding condition. The above mentioned various problems have been effectively solved, without sacrificing these preferable conditions, by the present invention characterized in that a nonwoven fabric layer material not impregnated with a liquid resin composition is used and that the materials for the molded article are subjected to depressurization in a mold and subsequently to compression-curing molding.

Thus, there is provided, according to the present invention, a method for producing a fiber-resin composite molded article having the properties of substantially uniformly reflecting and shielding electromagnetic waves, which comprises placing, on a mold for compression molding having a desired molding surface, an effective amount of an electroconductive nonwoven fabric for a surface layer, a woven fabric for an intermediate layer adjacent to the nonwoven fabric, and a molding material for a substrate layer containing at least a liquid resin material and a reinforcing fiber; and subjecting the molding materials to compression molding: characterized in that at least the nonwoven fabric out of the nonwoven fabric and the woven fabric is not substantially impregnated with a liquid resin material; the resulting molding materials are subjected to depressurization treatment in the mold at a vacuum pressure of not higher than 360 mmHg, and then the molding materials are subjected to compression molding.

Thus, there is also provided, according to the present invention, a fiber reinforced resin molded article for electro magnetic waves having the properties of uniformly reflecting and shielding electromagnetic waves in the range of VHF to EHF, which comprises a compression-molded cured laminated structure, having a plane or curved reflective surface, composed substantially of a surface layer, an intermediate layer and a substrate layer; said surface layer being an electroconductive nonwoven fabric-cured resin composite layer having an effective layer thickness of at least about 0.005 mm; said intermediate layer being a woven fabric-cured resin composite layer having an effective layer thickness of at least about 0.005 mm; said substrate layer being a fiber materia reinforced resin layer: characterized in that the molded article contains not more than about 90% of the cured resin component by weight of the resin component of the corresponding conventional compression-molded article, whereby the moding strain and deformation of the molded article are substantially decreased; and the nonwoven fabric-cured resin composite surface layer substantially excludes bubbles on and inside of the surface layer, whereby appearance and performances of the molded article are enhanced.

In the above-described method, a molded article having a decorative/ protective surface layer can be readily obtained by applying a resin material comprising, for example, polyester resin, acrylic resin or urethane resin to form a solid resin coating onto the molding surface of the mold prior to placing the moding materials thereon, and then conducting the compression molding. Incidentally, it is also possible to apply the resin surface layer onto the electroconductive nonwoven fabric layer after the molding.

The above mentioned depressurization treatment step is not especially restricted and can be carried out in an optional fashion as long as the liquid resin material does not flow out and gel between the surface of the nonwoven fabric layer and the heated mold before the step of the compression molding. Namely, the above mentioned passage "then the molding materials are subjected to compression molding" means that it is desirable to carry out the compression molding before such gelation of the liquid resin material is caused and preferably soon after a predetermined reduced pressure is achieved. For example, by the use of a mold as shown in FIG. 3, the depressurization treatment can be carried out by loosely closing the mold in a fashion to seal the mold and maintain air permeability / liquid permeability through the laminated materials, and connecting an evacuatbbKon duct in the mold with a vacuum tank outside of the molding system for approximately several seconds to ten odd seconds. Immediately thereafter, the aminated materials can be subjected to a compression molding step such as press molding.

DETAILED DESCRIPTION OF THE INVENTION

Action and Effects

Figure 1:
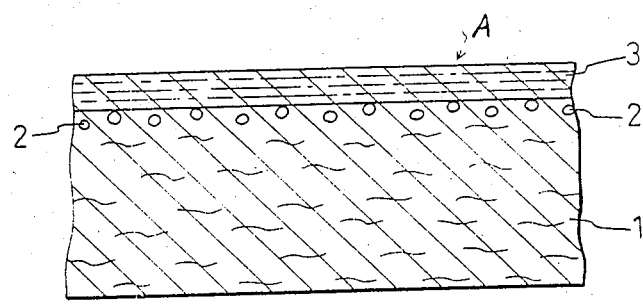
FIG. 1 is a cross-sectional partial view of the molded article A having an electroconductive surface layer according to the present invention.

The unexpectable effects according to the present invention are achieved by using a resin material in an amount preferably less than that conventionally used for such molded article to prevent the deformation due to molding strain of the reflective surface, and also substantially preventing formation of bubbles at the surface and inside of the nonwoven fabric layer, whereby producing a molded article having excellent performances and appearance. These effects, although not fully clarified, are believed to be achieved by the combined actions consisting essentially of the action to substantially eliminate possibilities of producing molding strain of a thermosetting resin molded artlcle and disordered distribution of the nonwoven fabric caused by the flow of the resin by using a relatively small amount of the resin and adapting the above mentioned three-layer FRP structure; and the action to substantially eliminate formation of bubbles which were apt to be formed at the reflective surface and inside of the nonwoven fabric layer by using at least a nonwoven fabric material not impregnated with the liquid resin composition and subjecting the molding materials to depressurization treatment step immediately before the compression molding step. The intermediate woven fabric layer acts to lead the liquid resin component to flow through the interstices of the fabric, thereby achieving the effects of preventing ununiform distribution, disorder arrangement and fracture of the nonwoven fabric caused by the flow of the liquid resin composition. Moreover, because a nonwoven fabric not impregnated with a liquid resin composition is used at least for the electroconductive nonwoven fabric layer in the present invention, the resulting molded article generally contains a resin component in an amount less than in the corresponding conventional articles; and compression molding can be conducted with using a relatively less amount of the liquid resin composition than in the conventional methods because the flow of the liquid resin composition is enhanced by the depressurization treatment prior to the compression molding. Also, there is obtained the effect that the molding strain and the like caused by the cure molding of the resin component are largely decreased. Thus, molded article having similar or superior performances can be obtained by using a relatively less amount of a resin component (generally not more than about 90% and, for example, about 70% by weight of the resin component used in the conventional molded articles). Also, the molded articles according to the invention are very advantageous in view of dimension stability, deformation, etc.

Description of the Preferred Embodiments

The term "the molded article having properties of uniformly reflecting and shielding electromagnetic waves" used herein means that the molded article has a substantially smooth reflective surface for electromagnetic waves, has the property of regularly reflecting electromagnetic waves in a predetermined direction without forming phase difference such as phase lag of the waves, and also has the property of preventing penetration of eectromagnetic waves therethrough without irregular reflection of the waves. Thus, the molded article according to the present invention can be advantageously used, by utilizing its uniformly reflecting property, as a curved or plane reflecting sheet or board for electromagnetic waves such as reflecting antennas as well as a plane or curved shielding sheet or board which does not cause irregular reflection of electromagnetic waves in an undesirable direction. The present molded articles are useful for electromagnetic waves in the range of VHF to EHF, and especially useful for electro-magnetic waves having a wave length of about 100 MHz to about 100 GHz but are not always restricted to such wave length.

The electroconductive nonwoven fabric mentioned above generally means a nonwoven fabric of inorganic, metallic or organic fibers having electroconductivity of at least about $1 \times 10$ ohm$^{-1}$cm$^{-1}$, preferably not less than about $1 \times 10^2$ ohm$^{-1}$cm$^{-1}$, and more preferably not less than $1 \times 10^3$ ohm$^{-1}$ cm$^{-1}$. The fibers of the nonwoven fabric include, for exampe, metal fibers, carbon fibers, inorganic or organic fibers surface-coated fully or partly with a metal (e.g. with about 5 to about 50% by weight of metal), electroconductive synthetic fibers and mixtures thereof, which are generally commercially available. For example, metal-coated glass fibers are advantageously employed. The diameter of the electroconductive fibers is preferably as small as possible for the electromagnetic waves - reflecting and shielding performances, and is generally less than about 30 microns in diameter. The above mentioned metal is exemplified by aluminum, nickel, silver, copper, zinc, an alloy thereof, and the like. Incidentally, the nonwoven fabric may contain some nonelectroconductive fibers unless the electroconductivity is substantially impaired.

The amount of the electroconductive nonwoven fabric to be used is required to be as dense as to ensure reflection and prevent penetration of electromagnetic waves therethrough. The nonwoven fabric-resin composite layer should have an effective layer thickness of at least about 0.005 mm. The upper limit of the amount thereof to be used is not especially restricted, but the larger amount is uneconomical. Since the nonwoven fabric layer is not impregnated with the liquid resin composition in advance, the amount of the nonwoven fabric to be used is such that the resin composition can permeate into the fabric satisfactorily in the course of compression molding. Thus, the thickness of the nonwoven fabric-resin composite layer is generally in the range of about 0.005 to about 1 mm and typically in the range of about 0.01 to about 0.2 mm. In this connection, the thickness of nonwoven fabric materials to be used will be approximately in the range of about 0.01 to 3 mm. Such thickness corresponds to about 25 to about 900 g/m$^2$ and preferably about 50 to about 300 g/m$^2$, in the case of a metal-coated glass fiber nonwoven fabric and to about 25 to about 400 g/m$^2$ and preferably about 30 to about 200 g/m$^2$ in the case of a carbon fiber nonwoven fabric. These are herein referred to as an effective layer thickness and an effective amount of the nonwoven fabric, respectively.

The woven fabric for the intermediate layer is to control the flow of the liquid resin composition into the nonwoven fabric layer in the course of compression molding for preventing the nonwoven fabric from ununiform dispersion, waviness and/or fracture. In other words, the woven fabric is to control the flow of the resin composition in such a direction that the liquid composition passes through the interstices of the woven fabric and to prevent the liquid composition from flowing substantially laterally along the woven fabric. Thus, it is required that the woven fabric has such thickness (molded thickness of at least about 0.005 mm) and strength (e.g. tensile strength of at least about 16 kgf/2.5 cm) as to control the above mentioned flow of the liquid resin composition. It is desired that the woven fabric has the interstices having a mesh size of smaller than about 5 mesh, usually smaller than about 10 mesh and preferably smaller than about 16 mesh. The mesh size, however, should not be so small as to impede the flow of the liquid composition. Moreover, the woven fabric should preferably have some flexibility so that it can compress the nonwoven fabric uniformly. The thickness of the woven fabric materials will be approximately in the range of about 0.01 to about 2 mm. Such thickness generally corresponds to about 25 to about 400 g/m$^2$ (preferably about 60 to about 200 g/m$^2$) in the case of ordinary woven fabrics. These are herein referred to as an effective thickness and an effective amount of the woven fabric, respectively.

There can be used reinforcing fiber materials of inorganic, organic or metallic substance mixed or impregnated with a liquid thermosetting resin composition for the above mentioned substrate layer. The fiber materials may be in the form of short fibers, bulky fibers, nonwoven fabrics, woven fabrics and mixtures thereof. Low-cost short fibers can be generally used with satisfactory results. Normally, a so-called sheet molding compound or bulk molding compound (hereinafter referred to as SMC or BMC) can be used advantageously. The amount to be used of the fiber material containing the liquid resin composition is such as to provide the present molded article with satisfactory strength and allow the resin composition mixed with or contained by impregnation in the fiber material to sufficiently permeate into the non-woven fabric during molding. The amount thereof is such as to get the molded thickness of the substrate layer of at least about 1 to about 10 mm, but is not especially restricted to this range.

The thermosetting resin to be used in the present invention means a resin component which can form a cured resin by applying thereto heat (e.g. about 80° to about 200° C.), a catalyst (e.g. radical polymerization catalysts, etc.) and/or a high-energy ionizing radiation (e.g. gamma rays, electron beams, etc.). The resins encompass (i) an ethylenically unsaturated resin containing a multiplicity of ethylenical double bonds which is substantially soluble in an ethylenically unsaturated monomer, (ii) an addition-polymerizable multifunctional resin and a compound for addition polymerization such as acid anhydrides, alcohols, amines or mercaptans, and the like.

The above mentioned ethylenically unsaturated resins include, for example, unsaturated polyester resins, allyl resins such as diallyl phthalate polymers, pendant-type unsaturated resins such as vinyl ester resins, derivative resins thereof and mixtures thereof. The reactive unsaturated monomers to substantially dissolve these resins include, for example, vinyl monomers such as styrene monomers, acrylonitrile, vinyl acetate and acrylic monomers; allyl monomers such as diallyl phthalate; derivatives thereof, and mixtures thereof. The ratio of the resins to the monomers to be used is generaly in the range of about 80/20 to about 40/60 by weight.

The addition-polymerizable multifunctional resins include, for example, epoxy resins such as glycidyl epoxide resins, which are used together with a substantially stochiometric amount of a compound for addition polymerization such as acid anhydrides.

The above mentioned crosslink-curable resins, polymerization catalysts, polymerization accelerators, compounds for addition polymerization, radiations, and the like can be readily selected by those skilled In the art. The period for compression molding will be generally about 3 to about 20 minutes.

The dimensional stability and the like are especially important for the present molded article. According to the present invention, the amount of the resin can be relatively decreased compared with the corresponding conventional method and, thus, molding strain, dimension stability and the like are largely improved. It is preferred, however, to use a thermoplastic resin in the form of a solution or suspension as an anti-shrinkage agent as a mixture with the thermosetting resin. The ratio of the liquid thermoplastic resin to the liquid thermosetting resin is generally about 35/65 to about 5/95 by weight, but is not particularly restricted to this range. These thermopastic resins are normally used in the form of a solution or suspension in an ethylenically unsaturated monomer such as a vinyl monomer.

The numeral values and the like in the process of the present invention are summarized below.

(1) It is desirable that the compound viscosity of the liquid resin composition used in the present invention before it is incorporated with a reinforcing fiber is not more than about $1 \times 10^9$ cps, usually not more than $5 \times 10^8$ cps and preferably approximately in the range of about $5 \times 10^7$ to about $1 \times 10^3$ cps. The term "compound viscosity" means a viscosity of the resin composition measured by means of a B-type Helipath viscometer.

(2) It is necessary that the depressurization treatment prior to the compression-curing molding is conducted by reducing the pressure in the mold to a vacuum pressure of not higher than about 360 mmHg, generally not higher than about 260 mmHg, preferably not higher than about 160 mmHg, more preferably not higher than about 100 mmHg, most preferably not higher than about 60 mmHg, and typically not higher than 30 mmHg.

(3) It is desirable that the molding pressure in the compression molding is at least about 10 kgf/cm$^2$ or more, preferably about 20 kgf/cm$^2$ or more, more preferably in the range of about 25 to about 100 kgf/cm$^2$, and typically in the range of about 40 to about 80 kgf/cm$^2$.

(4) The mold closing speed during molding is generally not higher than about 300 mm/minute, preferably not higher than about 240 mm/minute, and typically in the range of about 40 to about 200 mm/minute.

Figure 2:
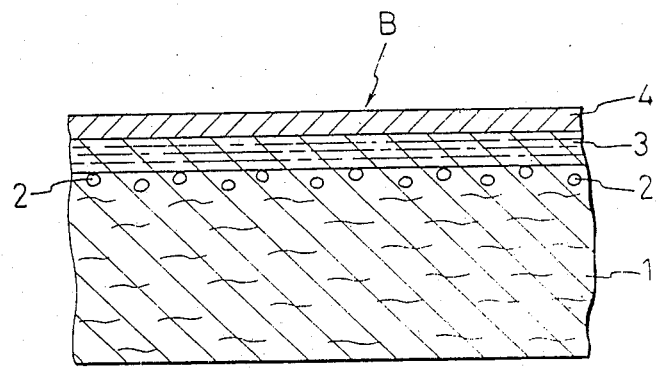
FIG. 2 is a cross-sectional partial view of the molded article B which was further provided with a protective layer on the molded article A illustrated in FIG. 1.

The molded article A in FIG. 1 shows a molded article having laminated structure for uniformly reflecting or shielding electromagnetic waves, consiting of an FRP substrate layer 1, a woven fabric-resin composite intermediate layer 2 formed on the substrate layer 1, and an electroconductive surface layer 3 which consists of an eectroconductive nonwoven fabric composite formed on the intermediate layer 2. The molded article B in FIG. 2 shows a similar molded article consisting of the above mentioned article A and a protective or decorative resin layer 4 formed on the electroconductive surface layer 3 of the molded article A. Such resin layer 4 may also be applied on the substrate layer 1, as necessary. The thickness of the protective resin layer 4 is generally in the range of about 0.02 to about 0.3 mm. Incidentally, the above mentioned woven fabric composite intermediate layer 2 not only effectively controls the flow of the liquid resin composition in the course of molding, but also provides the electroconductive layer 3 with a distinct layer structure in the construction of the molded article and also provides the molded article with dimension stability, etc. Thus, it is quite desirable that also the woven fabric composite intermediate layer does not contain bubbles and the like according to the present invention.

Figure 3:
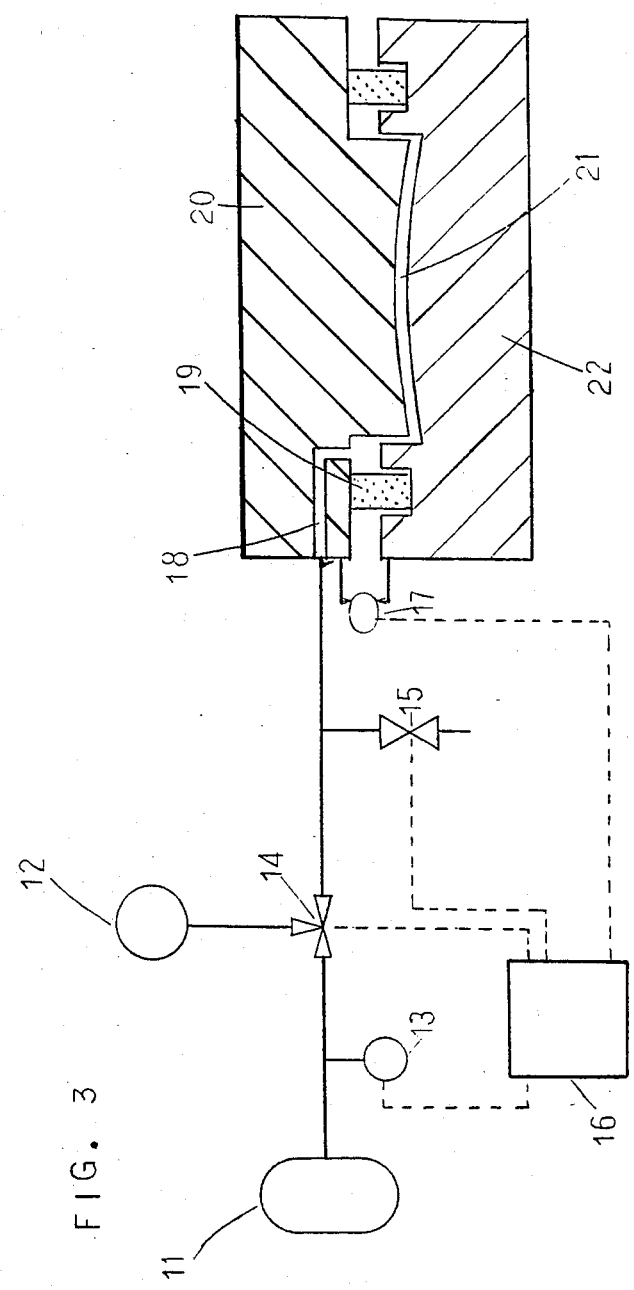
FIG. 3 is a partially cross-sectional schematic view showing a mold equipped with a vacuum depressurization apparatus.

A mold for compression molding equipped with a vacuum depressurization apparatus is illustrated in FIG.3. The mold comprises an upper mold portion 20 and a lower mold portion 22 which define a mold cavity 21 where the molding materials are placed. The upper mold portion 20 contains an evacuatlon duct 18 and resilient sealing means 19 attached thereto. The lower mold portion 22 has ejector maans (not shown) for the molded article. Between the mold portions, a mold position detector 17 is connected. The vacuum depressurization apparatus comprises a vacuum tank 11, a vacuum pump 12, a manometer 13, a three-way valve 14, a two-way valve 15, and a control system 16. The electronic control system 16 is communicated with the manometer 13, the three-way valve 14, the two-way valve 15, and the mold position detector 17, respectively. The evacuation duct 18 is connected to the valve 14 and the valve 15. The three-way valve 14 is then connected to both the vacuum pump 12 and the vacuum tank 11 via the manometer 13. One end of the two way valve 15 is opened to the atmosphere when dividing the mold.

EXAMPLES

In the following examples, amounts are based on weight unless otherwise specified. A solution of an unsaturated polyester resin in styrene monomer was used as a main component of the liquid crosslink-curable resin composition. The highly reactive polyester resin is produced from 1 mol isophthalic anhydride, 3 mols maleic anhydride and 4.5 mols propylene glycol, and has one double bond per molecular weight of about 300. Similar unsaturated polyester resin is exemplified by "Polymar 6819" of Takeda Yakuhin Kogyo K.K., Japan. About 60% of the unsaturated polyester resin was dissolved in about 40% of styrene monomer to adjust its viscosity to about 10 poises (25° C.). As an anti-shrinkage agent, was used a solution of about 30% of polystyrene (Diaflex HF-77 from Mitsubishi Monsanto K.K., Japan) dissolved in about 70% of styrene monomer.

EXAMPLE 1

(Working Example)

There was used an SMC for the FRP substrate layer composed of 50 parts of glass fiber of about 2.5 cm in length and about 200 parts of a liquid crosslinkable resin composition. The liquid resin composition consists essentially of 75 parts of the unsaturated polyester resin solution, 25 parts of the anti-shrinkage polystyrene resin solution, 100 parts of calcium carbonate, 1 part of t-butyl perbenzoate, 6 parts of zinc stearate releasing agent and 2 parts of magnesium oxide thickener, and has a viscosity of about $4 \times 10^3$ cps.

As the material for the woven fabric layer was used a 120 g/m$^2$, plain weave fabric of glass fiber (not impregnated with a liquid resin composition). As the material for the electro conductive layer was used a 80 g/m$^2$ nonwoven fabric (not impregnated with a liquid resin composition) of glass fiber coated with 40% by weight of aluminum. As the mold was used a mold having a surface of a convex paraboloid of revolution to be contacted with the nonwoven fabric layer. The mold was equipped with a sealing means for depressurization treatment and with an evacuating duct.

In the heated mold were placed the above mentioned three materials by laying the nonwoven fabric layer at the bottom and the SMC layer at the top. After the mold was loosely closed and sealed, the evacuating duct in the mold was connected to a vacuum tank and the pressure in the mold was reduced to about 30 mmHg in several seconds. Immediately thereafter, molding was carried out at 140° C. for 4 minutes by closing the mold under a pressure of 40 kgf/cm$^2$ and at a mold closing speed of 50 mm/minute.

There was thus obtained a molded board having dimensions of 600 mm in diameter and about 4 mm in thickness and also a surface of a concave paraboloid of revolution represented by the expression: $y^2+z^2=4\times FD\times x$ (FD=360 mm). The resulting molded board has a surface uniformly reflecting and shielding electromagnetic waves and has a gain of 37 dB measured by using a electromagnetic wave of $12\times 10^9$ Hz in frequency. The above mentioned procedures were repeated to produce 20 pieces of the parabolic molded boards. There was no board which was desired to mend by filling the surface of the electroconductive layer with a resin or the like; all the molded boards were excellent as commercial articles.

EXAMPLE 2

(Working Example)

The procedures of Example 1 were repeated except that as the woven fabric layer material was used a prepreg consisting of a 120 g/m$^2$ glass fiber woven fabric impregnated with the above mentioned liquid crosslinkable resin composition. There were produced 20 pieces of similar parabolic molded boards. The surface conditions thereof and the gain thereof as an antenna were excellent in the same degree as those of Example 1.

EXAMPLE 3

(Comparative Example)

The process of Example 1 was repeated except that as the electroconductive layer material was used a prepreg consisting of a 80 g/m$^2$, aluminum-coated glass fiber nonwoven fabric impregnated with the liquid crosslinkable resin composition and that the mold was not subjected to the depressurization treatment in the course of molding. There were thus obtained 20 pieces of parabolic molded boards.

The gain of the molded board measured by using the above mentioned electromagnetic wave was slightly short of 37 dB, which value did not make a large difference with the products of Example 1. However, there were many bubbles and bubble-like depressions of about 1 mm in diameter on the molded surface of the nonwoven fabric layer radially scattered in the direction of the periphery of the parabolic molded board. Thus, the resulting molded boards were commercially inferior in view of appearance. Incidentally, among the 20 pieces of the products, two of them needed mending by filling the surface of the electroconductive layer with a resin or the like to enhance the appearance, three of them were desired to mend by such filling, and five of them had some commercial problems although such mending was not especially needed. Incidentally, significant caution and skills were required for placing the nonwoven fabric impregnated with the liquid resin composition on the heated mold surface.

EXAMPLE 4

(Comparative Example)

Molding was carried out by using the same materials as in Example 2 under the same conditions as in Example 1 except that the mold was not depressurized in the course of molding. The results thereof were approximately the same as those in the comparative example of Example 3. Also, there were a significant amount of bubbles about 0.5 mm or smaller in diameter within the nonwoven fabric layer.

EXAMPLE 5

(Comparative Example)

Molding was carried out with using the same materials as used in Example 1 under the same conditions as in Example 1 except that the mold was not depressurized in the course of molding. The results thereof were approximately the same as the comparative example of Example 3. Also, there were many bubbles about 0.5 mm or smaller in diameter within both the nonwoven fabric layer and the woven fabric layer.

EXAMPLE 6

(Comparative Example)

The materials as used in Example 3 were subjected to the depressurization treatment in a mold and then molding under the same conditions as in Example 1. The results thereof did not make a large difference with those in the comparative Example 3; and thus the effects by the depressurization treatment in the course of the molding were not substantially recognized.

What is claimed is:

1. A method for producing a fiber-resin composite molded article having the properties of substantially uniformly reflecting and shielding electromagnetic waves, which composite placing, on a mold for compression molding having a desired molding surface, an effective amount of an electroconductive nonwoven fabric for a surface layer, a woven fabric for an intermediate layer adjacent to the nonwoven fabric, and a molding material for a substrate layer containing at least a liquid resin material and a reinforcing fiber, wherein at least said nonwoven fabric out of said nonwoven fabric and said woven fabric is not substantially impregnated with liquid resin material; subjecting the resulting molding materials to depressurization treatment in the mold at a vacuum pressure of not higher than 360 mmHg; and then, prior to substantial gelation of said liquid resin material of said substrate layer, subjecting the molding materials to compression molding.

2. The method according to claim 1, in which the vacuum pressure in the depressurization treatment is not higher than about 160 mmHg.

3. The method according to claim 1, in which the compression molding is conducted by compressing the molding materials under a molding pressure of not lower than about 10 kgf/cm$^2$ and at a mold closing speed of not more than about 300 mm/minute and curing the resin material.

4. The method according to claim 1, in which the resulting electroconductive nonwoven fabric-cured resin layer has molded thickness of at least about 0.005 mm, the woven fabric of the intermediate layer has a mesh size of not larger than about 5 mesh, and the resulting woven fabric-cured resin layer has molded thickness of at least about 0.005 mm.

5. The method according to claim 1, in which the resulting electroconductive nonwoven fabric-cured resin surface layer substantially excludes bubbles on and inside of the surface layer.

6. The method according to claim 1, in which the electroconductive nonwoven fabric has electroconductivity of at least about $1 \times 10$ ohm$^{-1}$cm$^{-1}$.

7. The method according to claim 1, in which the fiber of the nonwoven fabric comprises a metal fiber, carbon fiber, a metal-coated fiber, an electroconductive synthetic fiber, or mixtures thereof.

8. The method according to claim 1, in which the liquid curable resin material contains a solution of a thermosetting resin in a polymerizable monomer and a solution or suspension of a thermoplastic resin in a polymerizable monomer in a mixing ratio of ranging from about 65/35 to about 95/5 by weight.

9. The method according to claim 1, in which a sheet molding compound or bulk molding compound is used for the substrate layer.

10. The method according to claim 1, in which a resin surfacing agent for a protective and/or decorative top layer is applied onto the mold prior to placing the molding materials on the mold.

11. A fiber reinforced resin molded article for electromagnetic waves produced according to the process of claim 1, having the properties of uniformly reflecting and shielding electromagnetic waves in the range of VHF of EHF, which comprises a compression-molded cured laminated structure, having a plane or curved reflective surface, composed substantially of a surface layer, an intermediate layer and a substrate layer; said surface layer being an electroconductive nonwoven fabric-cured resin composite layer having an effective layer thickness of at least about 0.005 mm; said intermediate layer being a woven fabric-cured resin composite layer having an effective layer thickness of at least about 0.005 mm; said substrate layer being a fiber material reinforced resin layer, whereby the molding strain and deformation of the molded article are substantially decreased; and said nonwoven fabric-cured resin composite surface layer being essentially free of bubbles on and inside of the surface layer, whereby appearance and performances of the molded article are enhanced.

12. The molded article according to claim 11, in which the electroconductive nonwoven fabric has electroconductivity of at least about $1 \times 10$ ohm$^{-1}$cm$^{-1}$.

13. The molded article according to claim 11, in which the fiber of the nonwoven fabric comprises a metal fiber, carbon fiber, a metal-coated fiber, an electroconductive synthetic fiber, or mixtures thereof.

14. The molded article according to claim 11, in which the cured resin of the molded article contains a cured resin and a thermoplastic resin used as an antishrinkage agent.

15. The molded article according to claim 11, which is a parabola antenna for electromagnetic waves, the surface of the electroconductive nonwoven fabric layer being substantially a concave paraboloid of revolution.

16. The molded article according to claim 11, which is an electromagnetic wave-shielding sheet or board preventing penetration of the waves therethrough without substantially irregular reflection.

17. The molded article according to claim 11, in which the article has a protective and/or decorative top resin layer on the surface electroconductive layer.

18. The molded article according to claim 11, in which the fiber material reinforced resin substrate layer is a short fiber reinforced resin layer having thickness of about 1 to about 10 mm.

* * * * *